(12) United States Patent
Ezaki et al.

(10) Patent No.: US 7,235,826 B2
(45) Date of Patent: Jun. 26, 2007

(54) SOLID-STATE IMAGE PICKUP DEVICE

(75) Inventors: Takayuki Ezaki, Kanagawa (JP); Teruo Hirayama, Kanagawa (JP)

(73) Assignee: Sony Corporation, Tokyo (JP)

( * ) Notice: Subject to any disclaimer, the term of this patent is extended or adjusted under 35 U.S.C. 154(b) by 87 days.

(21) Appl. No.: 11/050,127

(22) Filed: Feb. 3, 2005

(65) Prior Publication Data

US 2005/0167704 A1 Aug. 4, 2005

(30) Foreign Application Priority Data

Feb. 4, 2004 (JP) ............................ P2004-028353

(51) Int. Cl.
*H01L 27/148* (2006.01)

(52) U.S. Cl. ..................................... 257/225; 257/233

(58) Field of Classification Search ................ 257/225, 257/233, 330

See application file for complete search history.

(56) References Cited

U.S. PATENT DOCUMENTS

| 3,924,265 | A | 12/1975 | Rodgers et al. |
| 4,173,765 | A | 11/1979 | Heald et al. |
| 5,541,438 | A | 7/1996 | Martin et al. |
| 6,259,085 | B1 | 7/2001 | Holland |
| 6,969,631 | B2 * | 11/2005 | Mouli et al. .................. 438/57 |

* cited by examiner

*Primary Examiner*—Mark V. Prenty
(74) *Attorney, Agent, or Firm*—Robert J. Depke; Rockey, Depke, Lyons & Kitzinger LLC

(57) ABSTRACT

A solid-state image pickup device 1 according to the present invention includes a semiconductor substrate 2 on which a pixel 20 composed of a photodiode 3 and a transistor is formed. The transistor comprising the pixel 20 is formed on the surface of the semiconductor substrate, a pn junction portion formed between high concentration regions of the photodiode 3 is provided within the semiconductor substrate 2 and a part of the pn junction portion of the photodiode 3 is extended to a lower portion of the transistor formed on the surface of the semiconductor substrate 2. According to the present invention, there is provided a solid-state image pickup device in which a pixel size can be microminiaturized without lowering a saturated electric charge amount (Qs) and sensitivity.

9 Claims, 6 Drawing Sheets

US 7,235,826 B2

SOLID-STATE IMAGE PICKUP DEVICE

The present application claims priority to Japanese Patent Application JP2004-028353, filed in the Japanese Patent Office Feb. 4, 2003; the entire contents of which is incorporated herein by reference.

BACKGROUND OF THE INVENTION

1. Field of the Invention

The present invention relates to a solid-state image pickup device in which a pixel size can be microminiaturized without lowering a saturated electric charge amount (Qs) and sensitivity.

2. Description of the Related Art

A CMOS (complementary metal-oxide semiconductor) type solid-state image pickup device is known as a solid-state image pickup device. This CMOS type solid-state image pickup device is composed of a plurality of pixels arranged in a predetermined pattern in which one pixel is comprised of a photodiode and a plurality of transistors, that is, so-called MOS (metal-oxide semiconductor) transistors. The photodiode is a photoelectric converting device for generating and accumulating signal electric charges corresponding to a received amount of incident light.

FIG. 1 of the accompanying drawings is a schematic cross-sectional view showing an example of a related-art CMOS type solid-state image pickup device that is applied to an image sensor. FIG. 1 shows, in particular, a main portion of the pixel. As shown in FIG. 1, in this CMOS type solid-state image pickup device 51, a pixel separation region 65 for separating each pixel is formed on a first conductivity type, for example, p type silicon semiconductor substrate 52. A photodiode 53 and a plurality of MOS transistors, that is, four MOS transistors of an electric charge readout transistor 54, a reset transistor 55, an amplifying transistor 56 and a vertical selection transistor (not shown) are formed on each separated region and thereby a unit pixel 60 is constructed. Then, a large number of pixels 60 are arrayed in a two-dimensional matrix fashion (that is, in an XY matrix fashion).

The photodiode 53 is composed of a second conductivity type, that is, an n type semiconductor region 61 [n$^+$ regions 61a, 61b] formed from the surface of the p type semiconductor substrate with a predetermined depth by ion implantation and a p type semiconductor region (p$^+$ region) 62 with a high impurity concentration formed on the surface of the n type semiconductor region 61.

Each of MOS transistors 54, 55 and 56 is constructed as follows. On the surface of the p type semiconductor substrate 52, there are formed n type semiconductor regions with a high impurity concentration, that is, n$^+$ source-drain regions 57, 58 and 59 by ion implantation so as to adjoin the photodiode 53.

The electric charge readout transistor 54 is composed of an n$^+$ source-drain region 57, an n$^+$ region 61a with a high impurity concentration on the surface side of the photodiode 53 and a gate electrode 72 formed on the substrate 72 between the two regions 57 and 61a through a gate insulating film 71.

The reset transistor 55 is composed of n$^+$ source-drain regions 57 and 58 and a gate electrode 73 formed on the substrate 52 between the two regions 57 and 58 through the gate insulating film 71. The n$^+$ source-drain region 57 is what might be called a floating diffusion (FD) region.

The amplifying transistor 56 is composed of n type source-drain regions 58 and 59 and a gate electrode 74 formed on the two regions 58 and 59 through the gate insulating film 71.

Although not shown, in a like manner, the vertical selection transistor is comprised of a pair of source-drain regions and a gate electrode formed on the substrate 52 between the two regions through a gate insulating film.

Circuit interconnections of the respective MOS transistors are similar to those which will be described later on and therefore need not be described. The n type source-drain region 58 for connecting the reset transistor 55 and the amplifying transistor 56 of each pixel is connected to a power supply interconnection 76 through a connector conductor 75. Further, a multilayer interconnection 77 including the power supply interconnection 76 is formed on the substrate 52 through an interlayer insulator 78.

This CMOS type solid-state image pickup device 51 introduces light from the surface side of the semiconductor substrate 52 into the photoediode 53, it photoelectically converts incident light by the photodiode 53 and then it accumulates signal electric charges corresponding to the received amount of incident light.

A cited patent reference 1 has proposed a solid-state image pickup device of an MOS type image sensor in which a photodiode, an electric charge readout transistor, a reset transistor, an amplifying transistor and a vertical transfer transistor comprising the above-mentioned unit pixel are formed on the same plane of the same substrate (see cited patent reference 1).

[Cited patent reference 1]: Official Gazette of Japanese Laid-open Patent Application No. 11-122532

Although the above-mentioned CMOS type solid-state image pickup device 51 is microminiaturized in order to integrate a large number of pixels 60 with a high integration degree, since a plurality of transistors such as the photodiode 53 and the electric charge readout transistor is disposed on the same plane of, in particular, each pixel region, each pixel requires the area on the plane and it is unavoidable that the area of one pixel is increased. For this reason, it becomes difficult to microminiaturize the pixel size. When the pixel size is microminiaturized, the area of the photodiode 53 is decreased and problems arise, in which the saturated electric charge amount (Qs) is lowered and in which sensitivity is lowered.

SUMMARY OF THE INVENTION

In view of the aforesaid aspect, it is an object of the present invention to provide a solid-state image pickup device in which a pixel size can be microminiaturized without lowering a saturated electric charge amount (Qs) and sensitivity.

According to an aspect of the present invention, there is provided a solid-state image pickup device which is comprised of a pixel composed of a photodiode and a transistor and a semiconductor substrate with the pixel formed thereon, wherein a pn junction portion formed between high concentration regions of the photodiode is formed within the semiconductor substrate and a part of the pn junction portion of the photodiode is extended to a lower portion of the transistor formed on the surface of the semiconductor substrate.

In the solid-state image pickup device according to the present invention, the pixel includes a charge readout transistor for reading out signal electric charges from the photodiode, a channel portion of the charge readout transistor being formed in the depth direction of the surface of the semiconductor substrate.

In the solid-state image pickup device according to the present invention, the charge readout transistor includes a gate electrode and a gate insulating film, the bottom portions of which are formed at the position deeper than the depth of the pn junction portion of the photodiode.

In the solid-state image pickup device according to the present invention, the charge readout transistor and the photodiode include a gate electrode corresponding to their connected portion, the gate electrode being located at the central portion of the photodiode.

In the solid state image pickup device according to the present invention, the charge readout transistor includes second conductivity type source-drain regions, one of the second conductivity type source-drain regions serving as a second conductivity type semiconductor region comprising the photodiode as well.

In the solid-state image pickup device according to the present invention, the charge readout transistor has an effective channel length determined by a distance between the second conductivity type semiconductor region comprising the photodiode formed by ion implantation and the other second conductivity type source-drain region formed on the surface of the semiconductor substrate of the charge readout transistor.

In the solid-state image pickup device according to the present invention, the charge readout transistor includes a first conductivity type semiconductor region formed between the second conductivity type semiconductor region comprising the photodiode and a gate insulating film in the portion corresponding to a peripheral portion of the gate electrode of the charge readout transistor or a bottom portion of the gate electrode.

Further, in the solid-state image pickup device according to the present invention, the first conductivity type semiconductor region comprising the photodiode and the gate insulating film of the charge readout transistor have formed therebetween a first conductivity type or second conductivity type semiconductor region of which concentration is lower than that of the high concentration semiconductor region.

Furthermore, in the solid-state image pickup device according to the present invention, the semiconductor substrate introduces light into the photodiode from its back.

According to the solid-state image pickup device of the present invention, since the pn junction formed between the high concentration regions of the photodiode is provided in the inside of the semiconductor substrate such that a part of the pn junction may be extended to the lower portion of the transistor formed on the surface of the semiconductor substrate, even when the pixel area is reduced, the large area of the photodiode can be maintained. Accordingly, it is possible to microminiaturize the pixel size without lowering the saturated electric charge amount (Qs) and sensitivity.

In the pixel, the transistor and the photodiode can be formed so as to overlap with each other in the upper and lower direction in a three-dimensional fashion by forming the channel portion of the electric charge readout transistor in the depth direction from the surface of the semiconductor substrate. Thus, it becomes possible to realize the microminiaturization of the pixel size while the area of the photodiode can be increased.

The bottom portions of the gate electrode and the gate insulating film of the electric charge readout transistor are formed at the positions deeper than the depth of the pn junction of the photodiode, whereby the channel portion can be reliably formed between the photodiode and the source-drain region. Thus, it is possible to make the operations of the electric charge readout transistor become reliable.

The gate electrode of the electric charge readout transistor is formed at the position of the central portion of the photodiode, whereby a distance from the periphery of the photodiode and a distance from the gate electrode can be made equal to each other. Thus, it is possible to transfer all signal electric charges from the photodiode to the electric charge readout transistor efficiently without remaining electric charges.

Since one second conductivity type source-drain region of the electric charge readout transistor serves as the second conductivity type semiconductor region comprising the photodiode as well, the effective channel length of the electric charge readout transistor can be determined.

Since the effective channel length of the electric charge readout transistor is determined based upon the length between the second conductivity type semiconductor region formed by ion implantation and the other second conductivity type source-drain region formed on the surface of the substrate of the electric charge readout transistor, even when some dispersions are produced in the position of the bottom portion of the gate electrode of the electric charge readout transistor, the effective channel length can be prevented from being fluctuated and hence it is possible to provide a highly-reliable solid-state image pickup device.

Since the first conductivity type semiconductor region is provided between the second conductivity type semiconductor region and the gate insulating film of the photodiode at the portion corresponding to the peripheral portion of the gate electrode of the electric charge readout transistor and the bottom portion of the gate electrode, it is possible to suppress the occurrence of a leakage current due to a defect of photodiode.

Since the first conductivity or second conductivity type semiconductor region with a concentration lower than that of the high concentration semiconductor region is formed between the first conductivity type high concentration semiconductor region and the gate insulating film of the photodiode, signal electric charges can be easily transferred in the electric charge readout transistor while the electric charge accumulation amount of the photodiode is being kept.

Since light is introduced from the back surface of the semiconductor region into the photodiode, while the area of the photodiode is being increased, it is possible to microminiaturize the pixel size without lowering the saturated electric charge amount and the sensitivity.

DESCRIPTION OF THE PREFERRED EMBODIMENTS

The present invention will now be described below with reference to the drawings.

Figure 1:
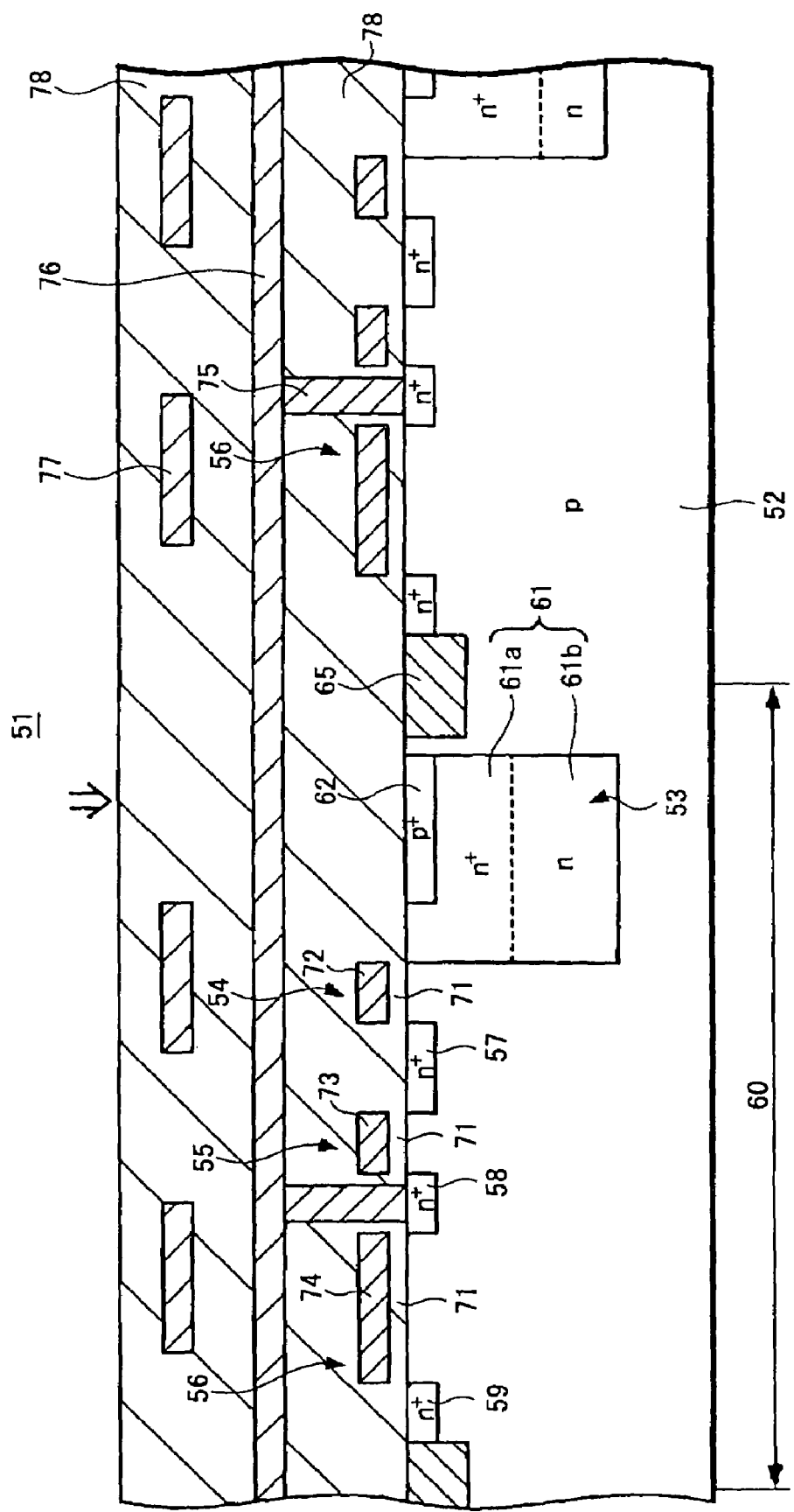
FIG. 1 is a schematic cross-sectional view showing a main portion of a solid-state image pickup device according to the related art.
Figure 2:
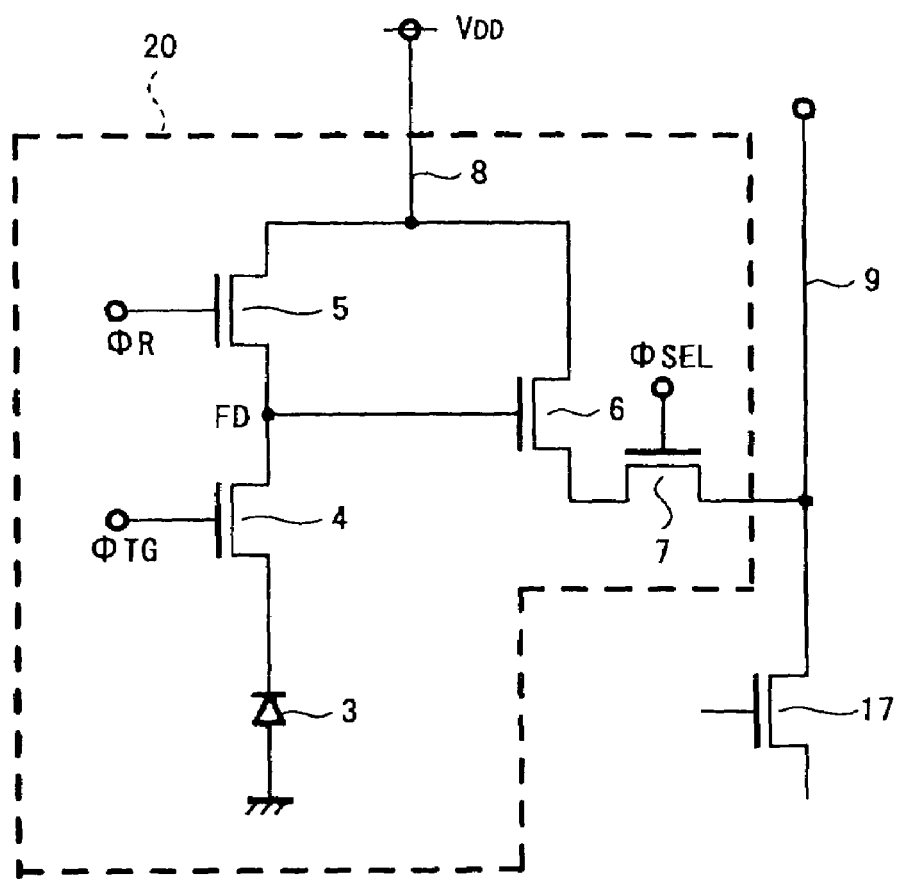
FIG. 2 is a circuit diagram showing an equivalent circuit of a unit pixel of a solid-state image pickup device according to an embodiment of the present invention.

FIG. 2 is a schematic circuit diagram showing an equivalent circuit of a unit pixel that can be applied to a solid-state image pickup device, that is, a CMOS type solid-state image device according to an embodiment of the present invention.

A unit pixel, generally depicted by reference numeral 20 in FIG. 2, of this CMOS type solid-state image pickup device is composed of a photodiode 3, four MOS transistors, that is, an electric charge readout transistor 4, a reset transistor 5, an amplifying transistor 6 and a vertical selection transistor 7. The photodiode 3 is connected to one main electrode of the electric charge readout transistor 4 and the other main electrode of the electric charge readout transistor 4 is connected to one main electrode of the reset transistor 5. The other main electrode of the reset transistor 5 is connected to one main electrode of the amplifying transistor 6 and the other main electrode of the amplifying transistor 6 is connected to one main electrode of the vertical selection transistor 7.

An FD (floating diffusion) region corresponding to a connection point between the electric charge readout transistor 4 and the reset transistor 5 is connected to the gate electrode of the amplifying transistor 6. A connection point between the reset transistor 5 and the amplifying transistor 6 is connected to a power supply line 8 led out from a voltage source Vdd. Further, the other main electrode of the vertical selection transistor 7 is connected to a vertical signal line 9. A horizontal selection transistor 17 is connected between the vertical signal line 9 and a horizontal signal line (not shown).

Then, a vertical readout pulse φ TG is applied to the gate electrode of the electric charge readout transistor 4, a reset pulse φ R is applied to the gate electrode of the reset transistor 5 and a vertical selection pulse φ SEL is applied to the gate electrode of the vertical selection transistor 7.

A large number of unit pixels 20 are arranged in a two-dimensional matrix fashion (in an XY matrix fashion) to thereby constitute a CMOS type solid-state image pickup device.

In this unit pixel 20, signal electric charges are accumulated in the photodiode 4 by photoelectric conversion. The vertical readout pulse φ TG is applied to the gate electrode of the electric charge readout transistor 4 to conduct the electric readout transistor 4 and signal electric charges of the photodiode 3 are transferred to the FD region to change the electric potential in the FD region. A signal voltage is applied from the FD region to the gate electrode of the amplifying transistor 6 and it is converted into a signal electric current by the amplifying transistor 6. On the other hand, the vertical selection pulse φ SEL is applied to the gate electrode of the vertical selection transistor 7 to conduct the vertical selection transistor 7 so that the signal electric current appears on the vertical signal line 9. This signal electric current is supplied through the horizontal selection transistor 17 to the horizontal signal line (not shown) and outputted to the outside from an output unit (not shown) in response to a vertical selection pulse (not shown).

A solid-state image pickup device, that is, a CMOS type solid-state image pickup device according to an embodiment of the present invention will be described next with reference to FIG. 3. In this embodiment, while the present invention is applied to the CMOS type solid-state image pickup device including the unit pixel 20 composed of one photodiode and four transistors shown in FIG. 2, the present invention is not limited thereto and can also be applied to a CMOS type solid-state image pickup device including other unit pixel composed of MOS transistors the number of which is different from that of the above-mentioned transistors comprising the unit pixel 20.

Figure 3:
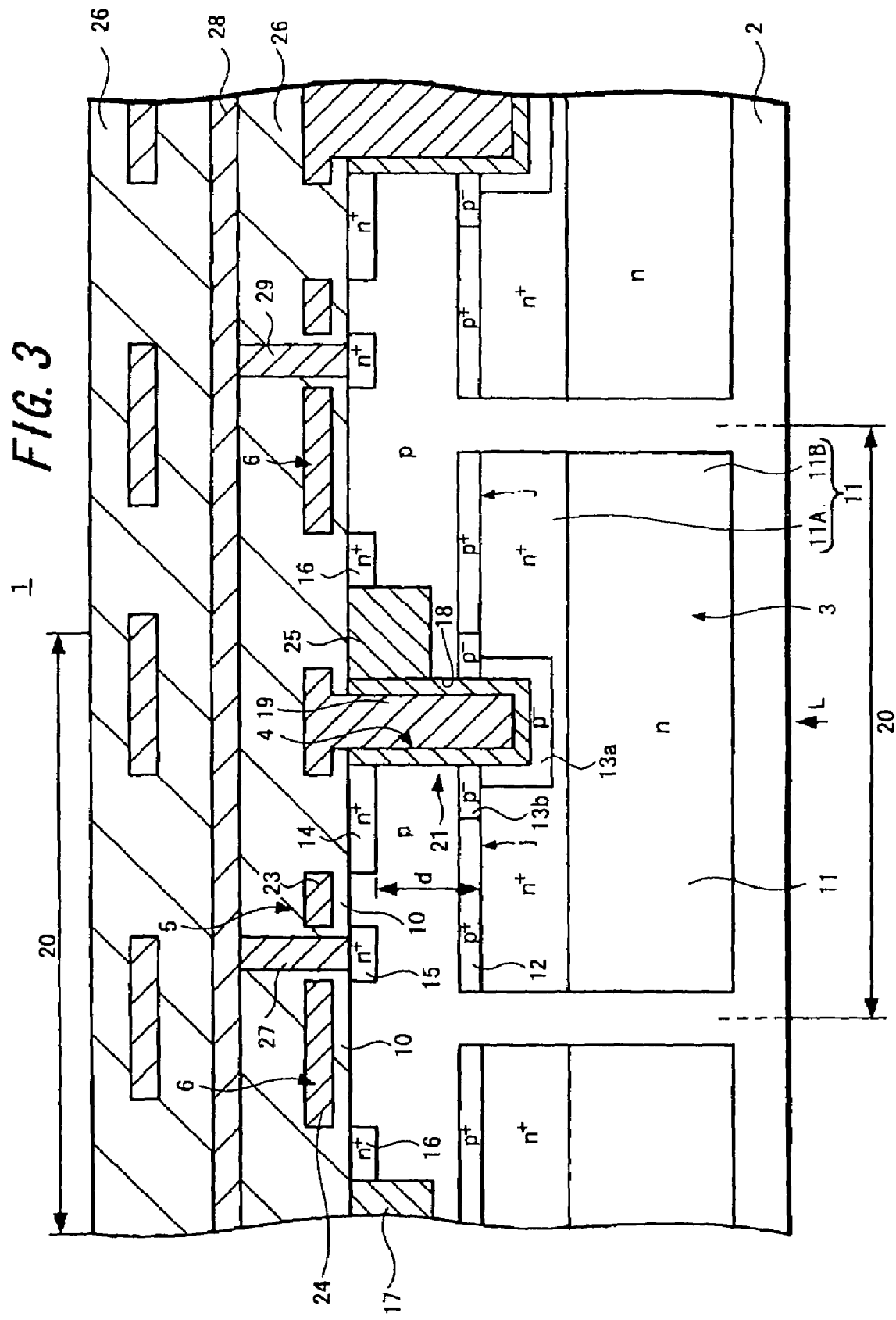
FIG. 3 is a schematic cross-sectional view showing a solid-state image pickup device according to an embodiment of the present invention.

FIG. 3 is a schematic cross-sectional view showing a main portion of a pixel, accordingly, the unit pixel composed of the photodiode 3 and the three transistors of the electric charge readout transistor 4, the reset transistor 5 and the amplifying transistor 6.

In the CMOS type solid-state image pickup device 1 according to this embodiment, a pixel separation region 25 for separating each pixel is formed on the surface of a first conductivity type, for example, a p type silicon semiconductor substrate 2 and the photodiode 3 and a plurality of MS transistors, in this embodiment, four MS transistors of the electric charge readout transistor 4, the reset transistor 5, the amplifying transistor 6 and the vertical selection transistor (not shown) are formed on each pixel separation region 25 and thereby the unit pixel 20 is formed. A large number of unit pixels 20 are arranged in a two-dimensional matrix fashion. The pixel separation region 25 is formed of a field insulating film ($SiO_2$) film.

According to this embodiment, in particular, a plurality of MS transistors, that is, the electric charge readout transistor 4, the reset transistor 5, the amplifying transistor 6 and the vertical selection transistor (not shown) are formed on the surface of the semiconductor substrate 2, and the photodiode 3 is formed on the inside of the semiconductor substrate 2 in such a manner that it may be located under the electric charge readout transistor 4, the reset transistor 5, the amplifying transistor 6 and the vertical selection transistor (not shown). At that time, the channel portion of the electric charge readout transistor 4 for reading out signal electric charges from the photodiode 3 is formed in the depth direction, preferably, in the vertical direction relative to the surface of the semiconductor substrate 2.

As shown in FIG. 3, the photodiode 3 is composed of a p type semiconductor region ($p^+$ region) 12 with a high impurity concentration formed on the surface side of the semiconductor substrate 2 and an n type semiconductor region 11 composed of a high concentration impurity region ($n^+$ region) 11A and a low impurity concentration region (n region) 11B adjoining the p type semiconductor region 12 and which are formed in the depth direction toward the back side of the semiconductor substrate 2. A principal pn junction j lies within the semiconductor substrate 2 and it is formed in such a manner that a part of the pn junction may be extended to the lower portion of the MOS transistor. In this case, as is clear from FIG. 3, the photodiode 3 is formed across the regions of the adjacent unit pixels 20 separated by the pixel separation region 25 when seen from the surface side of the semiconductor substrate 2. When seen from the back side of the semiconductor substrate 2, the region of the photodiode 3 corresponds to the region of the unit pixel 20.

In the electric charge readout transistor 4, a high impurity concentration n type semiconductor region, that is, so-called $n^+$ source-drain region 14 is formed on the surface of the semiconductor substrate 2. Also, a groove portion 18 is formed on the photodiode 3, for example, at the position deeper than the pn junction j from the surface of the semiconductor substrate 2 in such a manner that it may adjoin the n+ source-drain region 14. In other words, the groove portion 18 is formed in the depth direction reaching the inside of the n+ region 11A through the pn junction j, preferably, the groove portion 18 in the vertical direction should be formed relative to the substrate surface. A gate insulating film (for example, silicon oxide film, etc.) 10 is formed on the inner wall of this groove portion 18 across the n+ source-drain region 14 and the n+ region 11A of the photodiode 3, and a columnar gate electrode 19 is formed on the gate insulating film 10 so as to bury the groove portion 18. As a result, the channel portion 21 of the electric charge readout transistor 4 is formed in the depth direction, preferably, in the vertical direction of the surface of the semiconductor substrate 2 in correspondence with the inner wall of the groove portion 18. The bottom portions of the gate electrode 19 and the gate insulating film 10 may be formed in correspondence with the depth position of the pn junction j of the photodiode 3.

Further, in the portion corresponding to the lower peripheral portion containing the bottom portion of the gate electrode 19 of the electric charge readout transistor 4, a p type semiconductor region (p− region) with an impurity concentration lower than that of the p+ semiconductor region 12 or an n type semiconductor region (n− region) 13a, in this embodiment, a p− region is formed between the n+ region 11A constructing the photodiode 3 and the gate insulating film 10. Also, in the p type semiconductor region (p+ region) 12 with a high impurity concentration comprising the photodiode 3, a portion 13b near the gate insulating film 10 is formed as a p type region (p− region) with a low impurity concentration. In this case, the p− region 13a and the p− region 13b can be formed with the same impurity concentration.

Then, one n+ source-drain region 14, the n+ region 11A of the photodiode 3 and which serves as the other n+ source-drain region as well and the gate electrode 19 constitute the electric charge readout transistor 4. This n+ source-drain region 14 becomes the FD (floating diffusion) region.

All signal electric charges photoelectrically converted and accumulated by the photodiode 3 should be read out from the photodiode 3 to the electric charge readout transistor 4 with high efficiency. To this end, it is desirable that the gate portion of the electric charge readout transistor 4 corresponding to the connected portion between the electric charge readout transistor 4 and the photodiode 3, that is, the gate electrode 19 should be formed at the central portion in which distances from the peripheral portions of the photodiode 3 become substantially the same as shown in FIG. 3. In FIG. 3, the gate electrode 19 is formed so as to contact with the source-drain region 14 and the pixel separation region 25 through the gate insulating film 10.

At the same time the above-described n+ source-drain region 14 is formed, n type semiconductor regions with a high impurity concentration, that is, n+ source-drain regions 15 and 16 are formed on the other surface of the p type semiconductor substrate 2.

Then, the reset transistor 15 is comprised of the n+ source-drain regions 14 and 15 and a gate electrode 24 formed on the p type semiconductor substrate 12 between the two n+ source-drain regions 14 and 15 through the gate insulating film 10. Also, the amplifying transistor 16 is comprised of the n+ source-drain regions 15 and 16 and the gate electrode 24 formed on the p type semiconductor substrate 2 between the two n+ source-drain regions 15 and 16 through the gate insulating film 10. Although not shown, the vertical selection transistor (see FIG. 2) also is comprised of a pair of source-drain regions and a gate electrode formed on the p type semiconductor substrate 2 between the pair of source-drain regions through the gate insulating film 10 in a like manner.

Each of the above-mentioned gate electrodes 19, 23 and 24 can be formed of a polysilicon film, for example. Also, a connection conductor 24 and interconnections 27, 28 and the like also can be formed of polysilicon films, for example.

A multilayer interconnection 27 containing the power supply interconnection 28 is formed through the interlayer insulator 26 on the semiconductor substrate 2 on which there are formed the MOS transistors 4 to 6, the vertical selection transistor and the like. Of the multilayer interconnection, the power supply interconnection 28 is connected through a connection conductor 29 to the n+ source-drain region 14 which serves as the FD (floating diffusion) region of each pixel.

Figure 4:
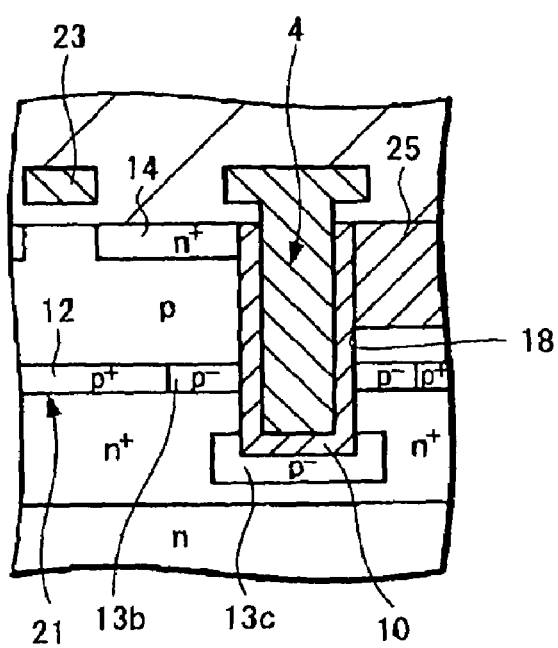
FIG. 4 is a partly cross-sectional view showing a main portion of a solid-state image pickup device according to another embodiment of the present invention.

While the p type semiconductor region (p− region) 13a with a low impurity concentration is formed between the n+ region 11A comprising the photodiode 13 and the gate insulating film 10 in the portion corresponding to the lower peripheral portion containing the bottom portion of the gate electrode 19 of the electric charge readout transistor 4 in the above-mentioned embodiment, the present invention is not limited thereto and the following variant is also possible. That is, as shown in FIG. 4 which is a schematic cross-sectional view showing a main portion of a solid-state image pickup device according to another embodiment of the present invention, a p type semiconductor region (p− region) 13c with a low impurity concentration may be formed between the n+ region 11A comprising the photodiode 3 and the gate insulating film 10 only in the portion corresponding to the bottom portion of the gate electrode 19 of the electric charge readout transistor 4.

In the above-mentioned CMOS type solid-state image pickup device 1, light L is introduced from the back of the semiconductor substrate 1 into the CMOS type solid-state image pickup device 1 and this light L is received by the photodiode 3. Although not shown, the semiconductor substrate 2 includes a color filter provided at the back thereof and also includes a suitable device such as an on-chip microlens at the position corresponding to each pixel 20.

A method of manufacturing the above-mentioned CMOS type solid-state image pickup device 1, in particular, a method of manufacturing a main portion containing the photodiode 3 and the electric charge readout transistor 4 according to the embodiment of the present invention will be described next with reference to FIGS. 5A to 5F.

Figure 5A:
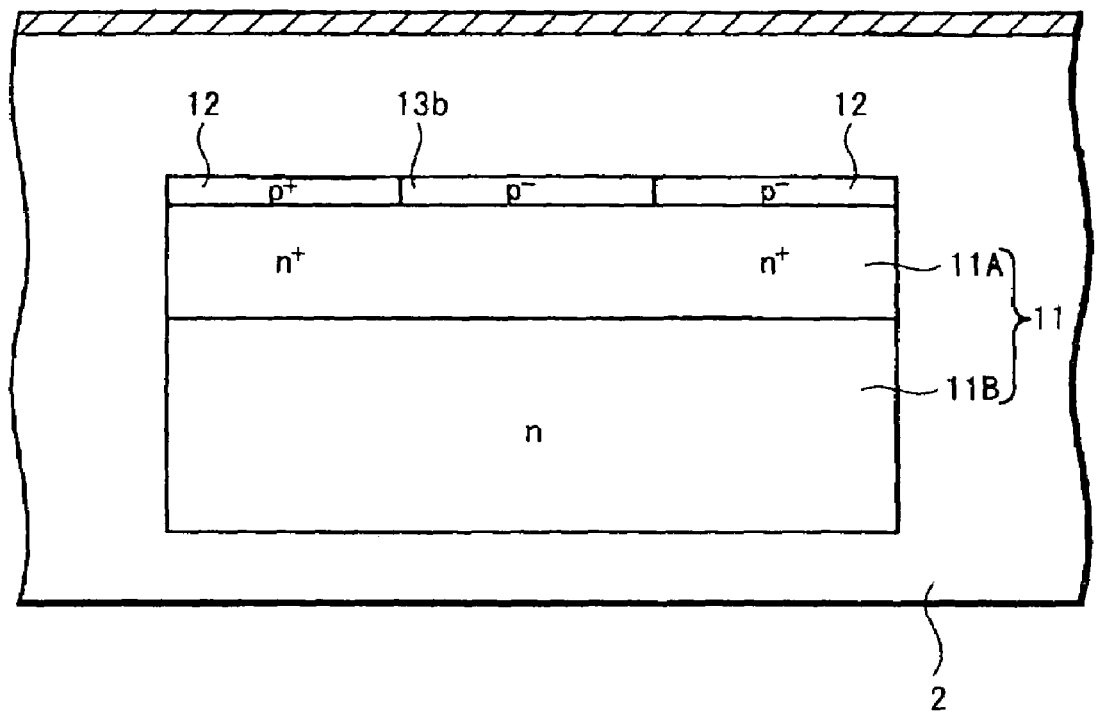
FIGS. 5A to 5F are respectively process diagrams showing a method of manufacturing a solid-state image pickup device according to the embodiment of the present invention.

First, as shown in FIG. 5A, the n type semiconductor substrate (n+ region 11A and n region 11B) comprising the photodiode 3, the p type semiconductor region, that is, the central p− region 13a and the p+ regions 12 at both sides of the p− region 13 are selectively deposited at the predetermined depth position of each pixel forming region of the p type semiconductor substrate 2 by ion implantation.

Figure 5B:
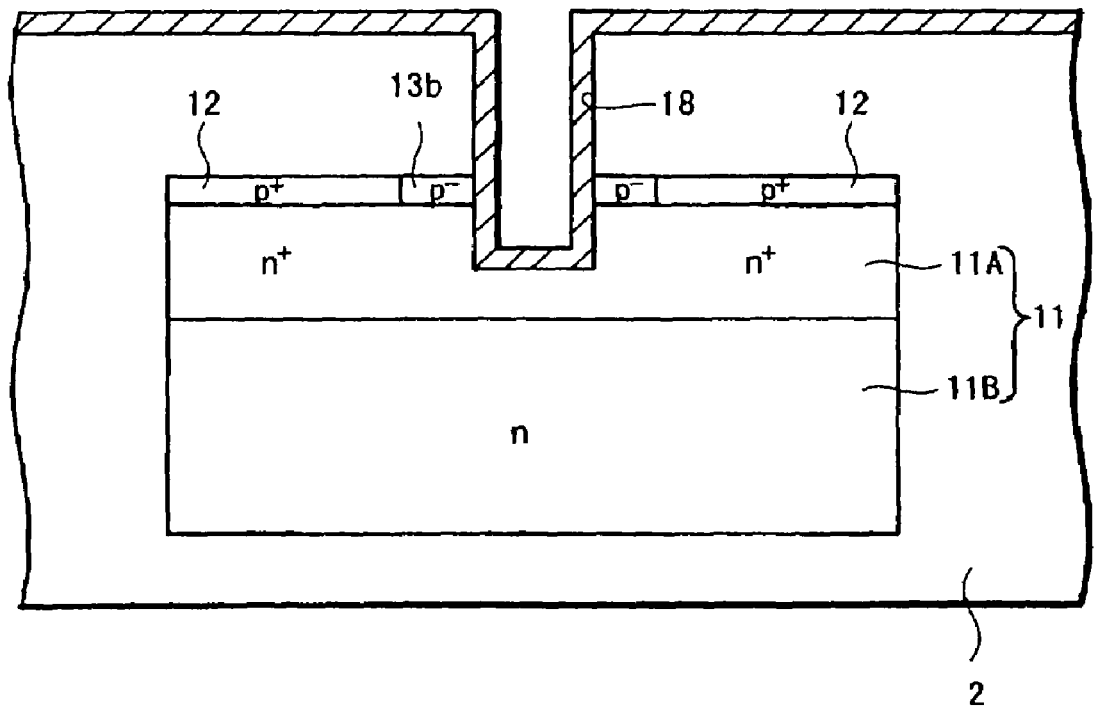

Next, as shown in FIG. 5B, the columnar groove portion 18 is formed in the substrate depth direction, preferably, in the vertical direction so as to reach the inside of the n+ region 11A from the surface of the semiconductor substrate 2 in correspondence with the central portion of the p− region 13b by selective etching, for example. Then, the gate insulating film (for example, silicon oxide film) 10 is deposited on the inner wall surface of the columnar groove portion 18 and the surface of the substrate 2 by a CVD (chemical vapor deposition) method or a thermal oxidation method.

Figure 5C:
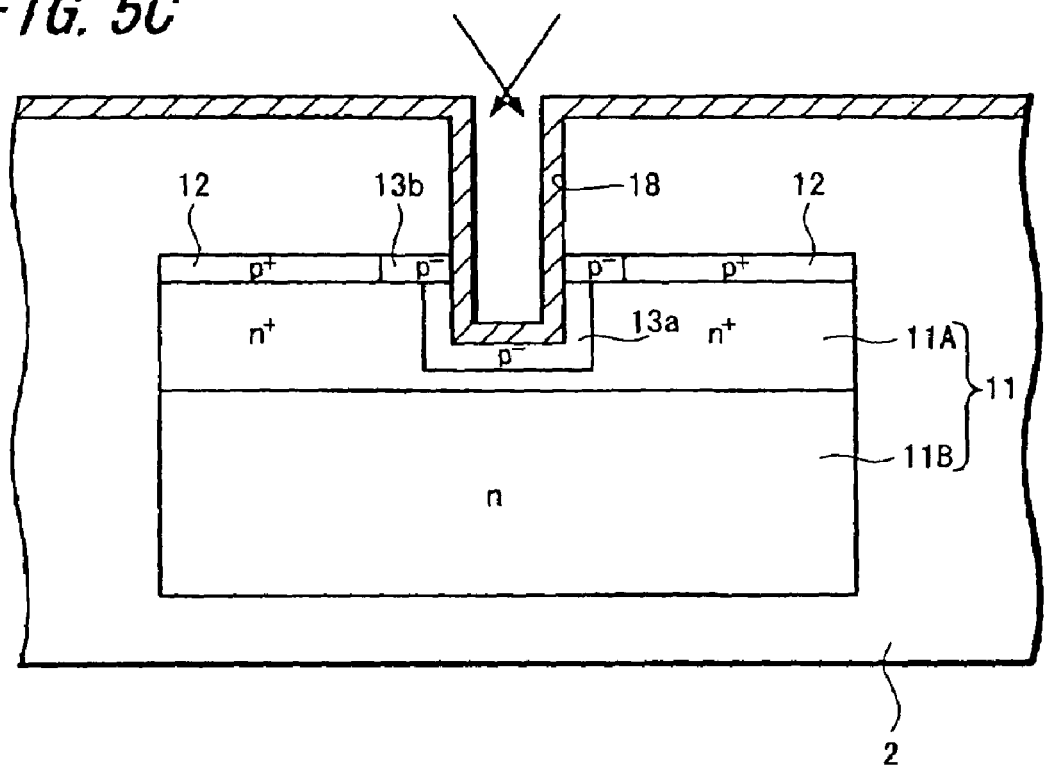

Next, as shown in FIG. 5C, the p⁻ region 13a is formed on the n⁺ region 11A of the photodiode 3 at its portion corresponding to the lower peripheral portion containing the bottom portion of the groove 18 by implanting ions of p type impurities with a low concentration from the oblique directions.

Figure 5D:
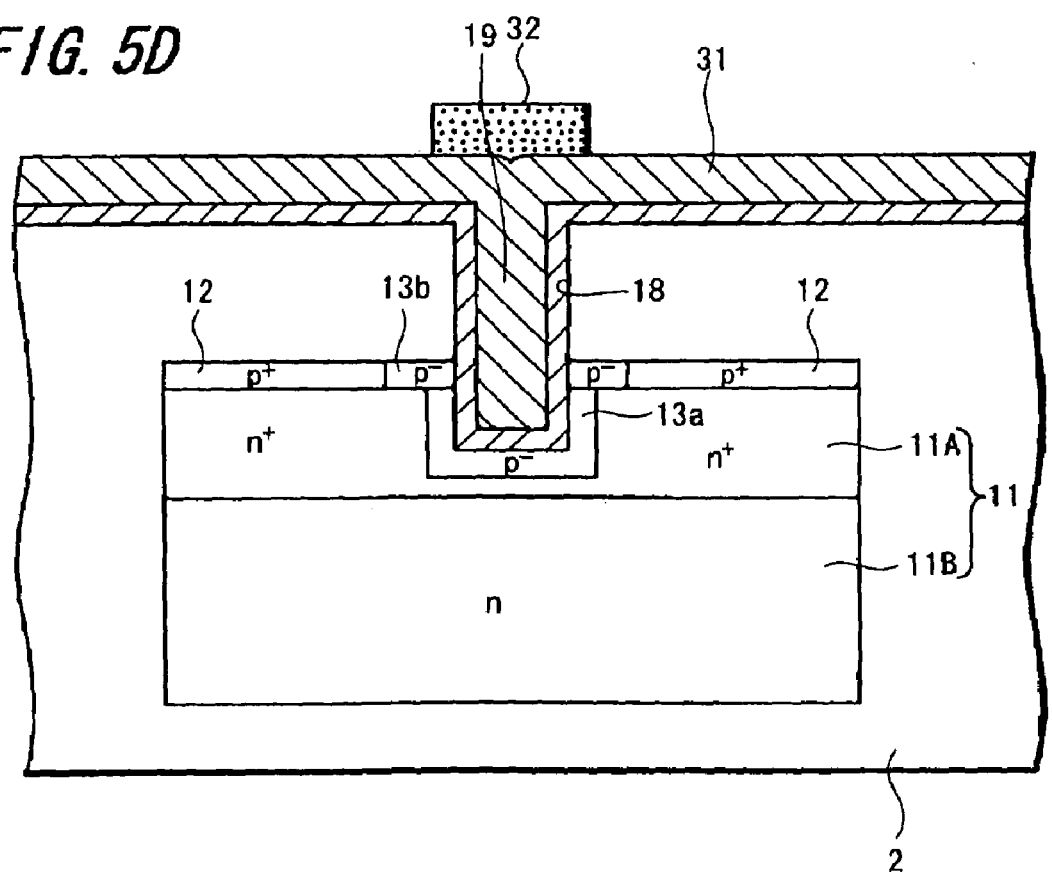

Next, as shown in FIG. 5D, a polysilicon film 31 is deposited on the whole surface of the surface of the substrate 2 so as to bury the groove portion 18 and a resist mask 32 is formed on the region in which the gate electrode is to be formed.

Figure 5E:
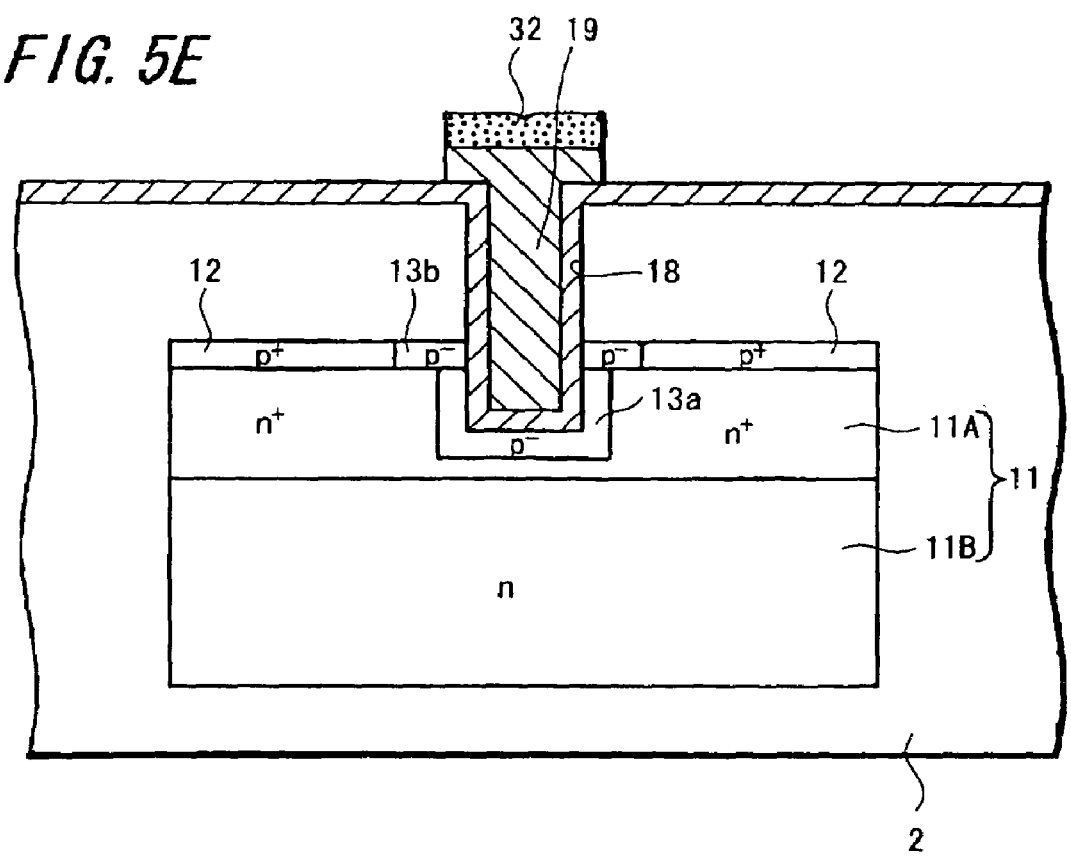

Next, as shown in FIG. 5E, the columnar gate electrode 19 buried into the groove 18 is formed by patterning the polysilicon film 31 through the resist mask 32.

Figure 5F:
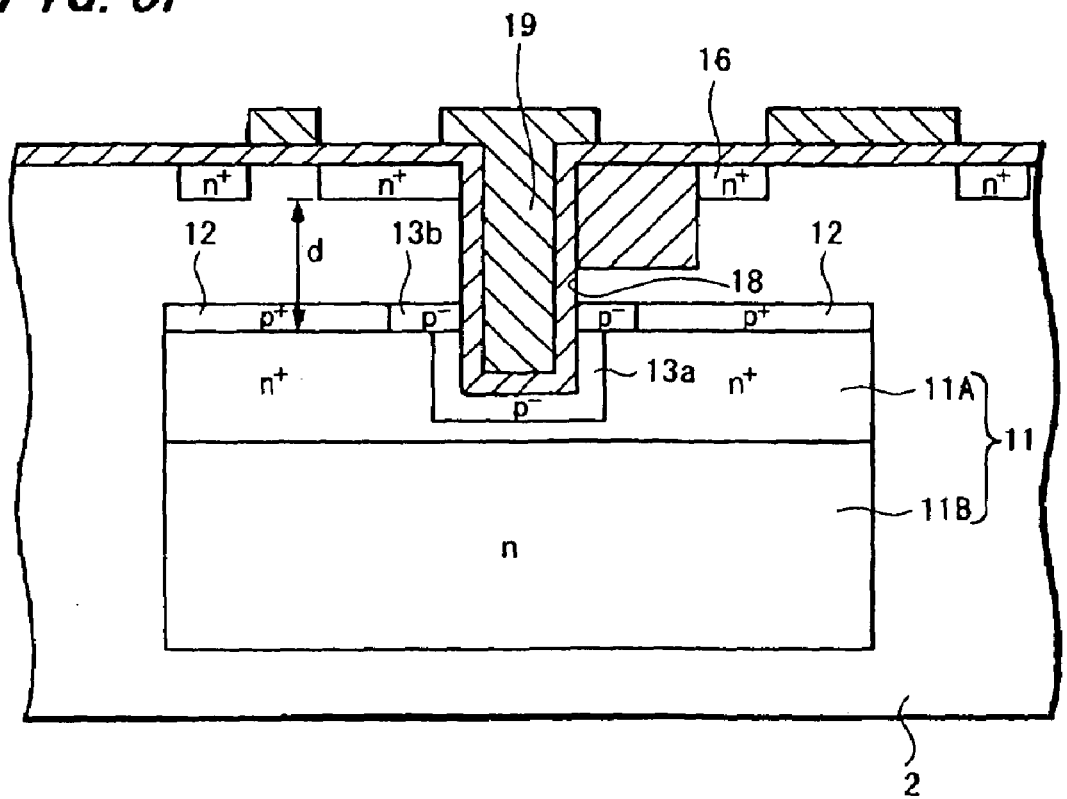

Next, as shown in FIG. 5F, the pixel separation region 25 and the source-drain regions 14, 15 and 16 of the respective MOS transistors are formed by ion implantation. Then, the gate electrodes 23 and 24 formed of other polysilicon films are formed. The gate electrodes 19, 23, 24 and the like can be formed at the same time.

Also, it is possible to form the columnar gate electrode 19 by forming the groove portion 18 after the respective MOS transistors were formed.

According to this manufacturing method, since the photodiode 3 is formed by ion implantation before the electric charge readout transistor 4 is formed, even when dispersions occur in the process for forming the groove portion 18, an effective gate length d can be determined easily and accurately. That is, the effective gate length d is determined based upon a distance between the n⁺ region 11A comprising the photodiode 3 and the bottom portion of the n⁺ source-drain region 14 of the electric charge readout transistor 4.

According to the CMOS type solid-state image pickup device of the above-mentioned embodiments, since the photodiode 3 is located in the pixel region 20 in a three-dimensional fashion such that it may be located under a plurality of MOS transistors formed on the substrate surface, for example, the electric charge readout transistor 4, the reset transistor 5, the amplifying transistor 6, the vertical transfer register (not shown) and the like, while the area of the photodiode 3 is being increased, the area of the pixel can be reduced. That is, since the area of the photodiode is increased and incident light is received from the back of the substrate, it is possible to microminiaturize the pixel size without lowering the saturated electric charge amount (Qs) and sensitivity.

Electric charges can be read out from the photodiode 3 by the electric charge readout transistor 4 of which channel portion 21 is formed in the depth direction, preferably, in the vertical direction relative to the surface of the semiconductor substrate 2. Also, when the gate electrode 19 of the electric charge readout transistor 4 is located at the central portion of the photodiode 3, signal electric charges can be efficiently read out from the whole region of the photodiode 3 through the channel portion 21 to the electric charge readout transistor 4. Accordingly, it becomes easy to read out electric charges from the photodiode 3 electrically.

Since the n⁺ source-drain region 14 of the electric charge readout transistor 4 serves as the n⁺ region 11A comprising the photodiode 3 as well, there can be determined the effective channel length d of the electric charge readout transistor 4.

The bottom portions of the gate electrode 19 and the gate insulating film 10 of the electric charge readout transistor 4 are formed at the position identical to the depth of the pn junction j of the photodiode 3 or at the position deeper than the pn junction j, whereby the channel portion 21 can be reliably formed between the photodiode 3 and the n⁺ source-drain region 14 and the electric charge readout transistor 4 can be operated reliably.

Also, since the n⁺ region 11A of the photodiode 3 serves as the other n⁺ source-drain region of the electric charge readout transistor 4 as well, the bottom portion of the columnar gate electrode 19 of the electric charge readout transistor 4 is extended to the position deeper than the position of the pn junction j of the photodiode 3 and the electric charge readout transistor 4 is formed after the photodiode 3 was formed, the effective gate length d of the electric charge readout transistor 4 can be determined by the depth position of the n⁺ region 11A of the photodiode 3.

More specifically, even when dispersions occur in the process for forming the groove portion 18, it is possible to determine the accurate effective gate length d. Further, since the p⁻ region 13a is formed between the gate insulating film 10 of the electric charge readout transistor 4 and the n⁺ region 11A of the photodiode 3, it is possible to suppress a leakage current from being produced due to defects of the photodiode 3. Furthermore, since the p⁻ region 13b is formed between the gate insulating film 10 of the electric charge readout transistor 4 and the p⁺ semiconductor region 12 of the photodiode 3, while the electric charge accumulation capacity of the photodiode 3 is being maintained, it becomes possible to facilitate transfer of electric charges in the electric charge readout transistor 4.

According to the solid-state image pickup device of the present invention, since the pn junction formed between the high concentration regions of the photodiode is provided in the inside of the semiconductor substrate such that a part of the pn junction may be extended to the lower portion of the transistor formed on the surface of the semiconductor substrate, even when the pixel area is reduced, the large area of the photodiode can be maintained. Accordingly, it is possible to microminiaturize the pixel size without lowering the saturated electric charge amount (Qs) and sensitivity.

In the pixel, the transistor and the photodiode can be formed so as to overlap with each other in the upper and lower direction in a three-dimensional fashion by forming the channel portion of the electric charge readout transistor in the depth direction from the surface of the semiconductor substrate. Thus, it becomes possible to realize the microminiaturization of the pixel size while the area of the photodiode can be increased.

The bottom portions of the gate electrode and the gate insulating film of the electric charge readout transistor are formed at the positions deeper than the depth of the pn junction of the photodiode, whereby the channel portion can be reliably formed between the photodiode and the source-drain region. Thus, it is possible to make the operations of the electric charge readout transistor become reliable.

The gate electrode of the electric charge readout transistor is formed at the position of the central portion of the photodiode, whereby a distance from the periphery of the photodiode and a distance from the gate electrode can be made equal to each other. Thus, it is possible to transfer all signal electric charges from the photodiode to the electric charge readout transistor efficiently without remaining electric charges.

Since one second conductivity type source-drain region of the electric charge readout transistor serves as the second conductivity type semiconductor region comprising the photodiode as well, the effective channel length of the electric charge readout transistor can be determined.

Since the effective channel length of the electric charge readout transistor is determined based upon the length between the second conductivity type semiconductor region formed by ion implantation and the other second conductivity type source-drain region formed on the surface of the substrate of the electric charge readout transistor, even when some dispersions are produced in the position of the bottom portion of the gate electrode of the electric charge readout transistor, the effective channel length can be prevented from being fluctuated and hence it is possible to provide a highly-reliable solid-state image pickup device.

Since the first conductivity type semiconductor region is provided between the second conductivity type semiconductor region and the gate insulating film of the photodiode at the portion corresponding to the peripheral portion of the gate electrode of the electric charge readout transistor and the bottom portion of the gate electrode, it is possible to suppress the occurrence of a leakage current due to a defect of photodiode.

Since the first conductivity or second conductivity type semiconductor region with a concentration lower than that of the high concentration semiconductor region is formed between the first conductivity type high concentration semiconductor region and the gate insulating film of the photodiode, signal electric charges can be easily transferred in the electric charge readout transistor while the electric charge accumulation amount of the photodiode is being kept.

Since light is introduced from the back of the semiconductor region into the photodiode, while the area of the photodiode is being increased, it is possible to microminiaturize the pixel size without lowering the saturated electric charge amount and the sensitivity.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid-state image pickup device comprising:
   a pixel comprised of a photodiode and a transistor; and
   a semiconductor substrate with said pixel, wherein a pn junction portion formed between high concentration impurity regions of said photodiode is formed within said semiconductor substrate and a part of said pn junction portion of said photodiode is extended to a lower portion of said transistor formed at the surface of said semiconductor substrate, and wherein the pn junction of the the photodiode is formed across regions of adjacent unit pixels with a pixel separation region therebetween.

2. A solid-state image pickup device comprising:
   a pixel comprised of a photodiode and a transistor; and
   a semiconductor substrate with said pixel, wherein a pn junction portion formed between high concentration impurity regions of said photodiode is formed within said semiconductor substrate and a part of said pn junction portion of said photodiode is extended to a lower portion of said transistor formed at the surface of said semiconductor substrate;
   wherein said pixel includes a charge readout transistor for reading out signal electric charges from said photodiode a channel portion of said charge readout transistor being formed in the depth direction of the surface of said semiconductor substrate.

3. A solid-state image pickup device according to claim 2, wherein said charge readout transistor includes a gate electrode and a gate insulating film, the bottom portions of which are formed at the position deeper than the depth of said pn junction portion of said photodiode.

4. A solid-state image pickup device according to claim 2, wherein said charge readout transistor includes a gate electrode, said gate electrode being located at the central portion of said photodiode.

5. A solid state image pickup device according to claim 2, wherein said substrate is a first conductivity type and said charge readout transistor includes second conductivity type source-dram regions.

6. A solid-state image pickup device according to claim 5, wherein said charge readout transistor has an effective channel length determined by a distance between said second conductivity typo semiconductor region comprising said photodiode formed by ion implantation and a second conductivity type source-drain region formed at the surface of said semiconductor substrate.

7. A solid-state image pickup device according to claim 5, wherein said charge readout transistor includes a first conductivity type semiconductor region formed between said second conductivity type semiconductor region comprising said photodiode and a gate insulating film.

8. A solid-state image pickup device according to claim 7, wherein said first conductivity type semiconductor region comprising said photodiode and said gate insulating film of said charge readout transistor have formed therebetween a first conductivity type or second conductivity type semiconductor region with an impurity concentration which is lower than that of said high concentration semiconductor region.

9. A solid-state image pickup device according to claim 1, wherein said semiconductor substrate introduces light into said photodiode from its back.

* * * * *